United States Patent
Wu

(10) Patent No.: US 6,171,893 B1
(45) Date of Patent: Jan. 9, 2001

(54) METHOD FOR FORMING SELF-ALIGNED SILICIDED MOS TRANSISTORS WITH ESD PROTECTION IMPROVEMENT

(75) Inventor: Shye-Lin Wu, Hsinchu (TW)

(73) Assignee: Texas Instruments - Acer Incorporated, Hsin-Chu (TW)

( * ) Notice: Under 35 U.S.C. 154(b), the term of this patent shall be extended for 0 days.

(21) Appl. No.: 09/366,606

(22) Filed: Aug. 3, 1999

Related U.S. Application Data

(63) Continuation-in-part of application No. 08/996,694, filed on Dec. 23, 1997, now Pat. No. 6,022,769.

(51) Int. Cl.$^7$ ............................................. H01L 21/8238
(52) U.S. Cl. ........................... 438/200; 438/237; 438/664
(58) Field of Search .................................. 438/200, 213, 438/225, 230, 231, 232, 237, 655, 656, 664

(56) References Cited

U.S. PATENT DOCUMENTS

| | | | |
|---|---|---|---|
| 5,272,097 | * 12/1993 | Shiota | 438/200 |
| 5,498,892 | * 3/1996 | Walker et al. | 257/336 |
| 5,559,352 | * 9/1996 | Hsue et al. | 257/328 |
| 5,589,423 | * 12/1996 | White et al. | 438/664 |
| 5,856,214 | * 1/1999 | Yu | 438/237 |

\* cited by examiner

*Primary Examiner*—Chandra Chaudhari
(74) *Attorney, Agent, or Firm*—Harness, Dickey & Pierce, P.L.C.

(57) ABSTRACT

The method of forming MOS transistors includes the following steps. First, isolation regions are formed in the semiconductor substrate to separate the semiconductor substrate into an ESD protective region and a functional region. A gate insulator layer is formed on the substrate and a polysilicon layer is formed on the gate insulator layer. The polysilicon layer is then patterned to form gate structures on the ESD protective region and the functional region. The semiconductor substrate is doped for forming a first doped region and an insulator layer is formed over the semiconductor substrate. A portion of the insulator layer and a portion of the gate insulator layer are removed to form spacer structures and an insulator block. The semiconductor substrate is doped for forming a second doped region. An insulator opening is defined within the insulator block. The semiconductor substrate is then doped for forming a third doped region. In the preferred embodiments, the third doped region has opposite type dopants with the second doped region and the first doped region. A first thermal annealing is then performed to the semiconductor substrate to drive in dopants. A metal layer is then formed on the semiconductor substrate and a second thermal annealing is performed to the semiconductor substrate to form a metal silicide layer on the gate structures, and on the substrate over the second doped region and the third doped region.

20 Claims, 4 Drawing Sheets

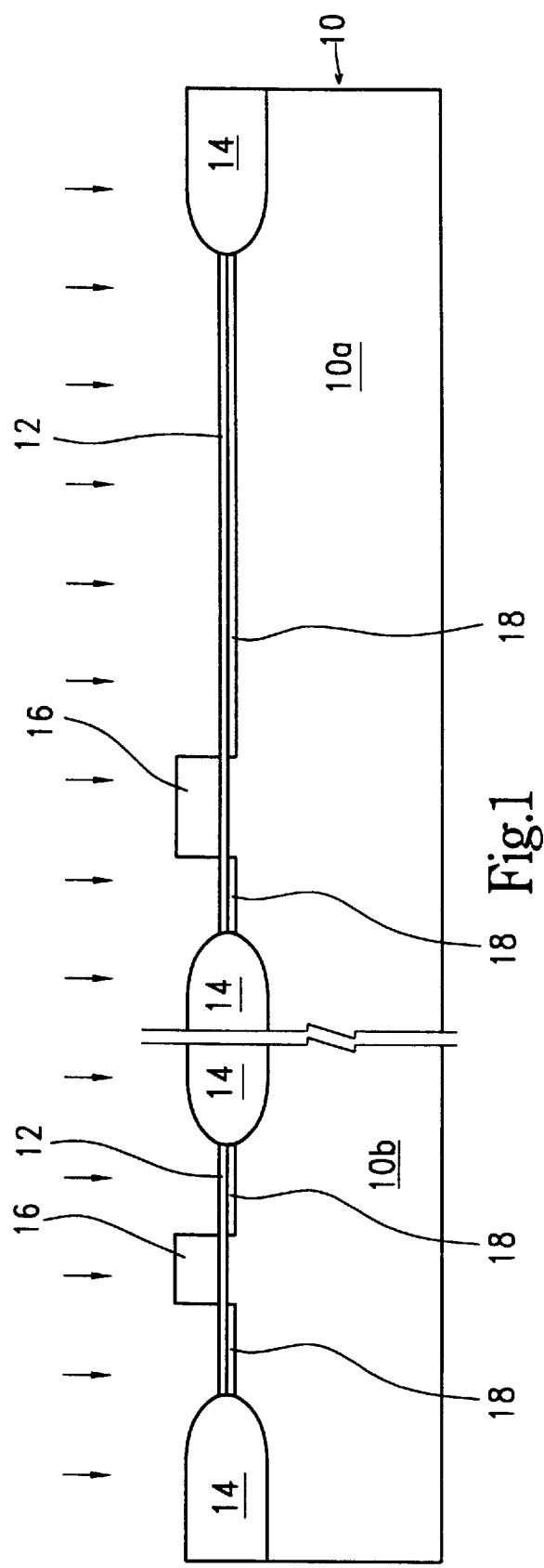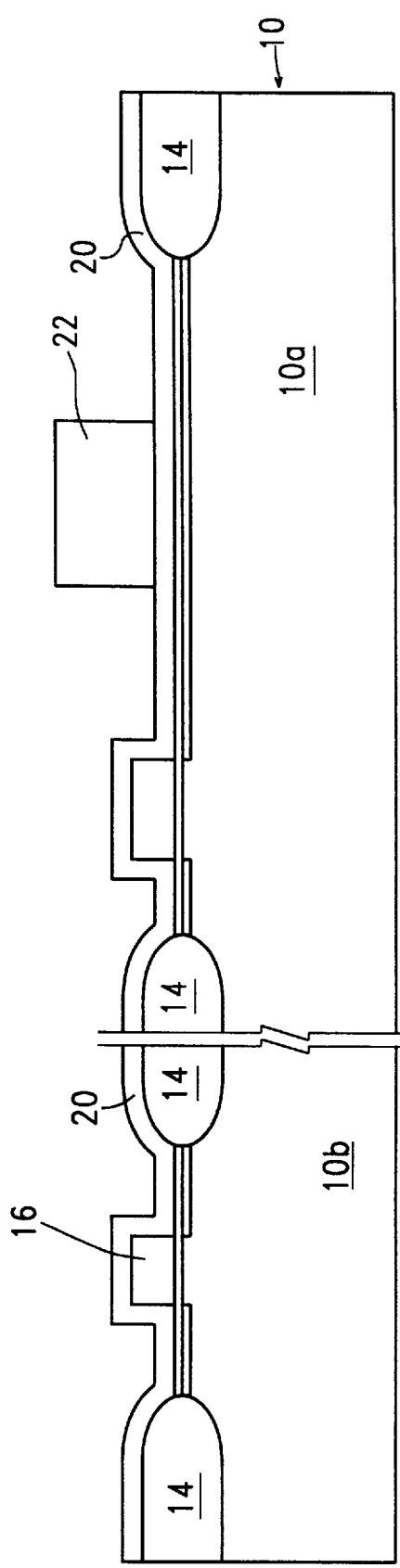

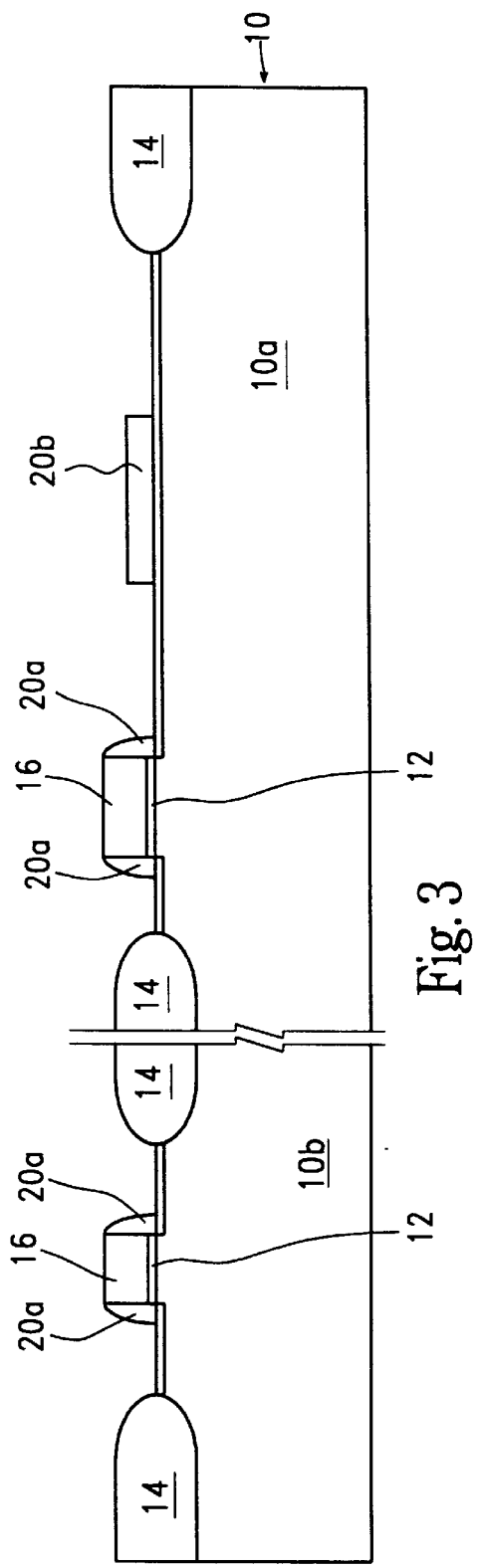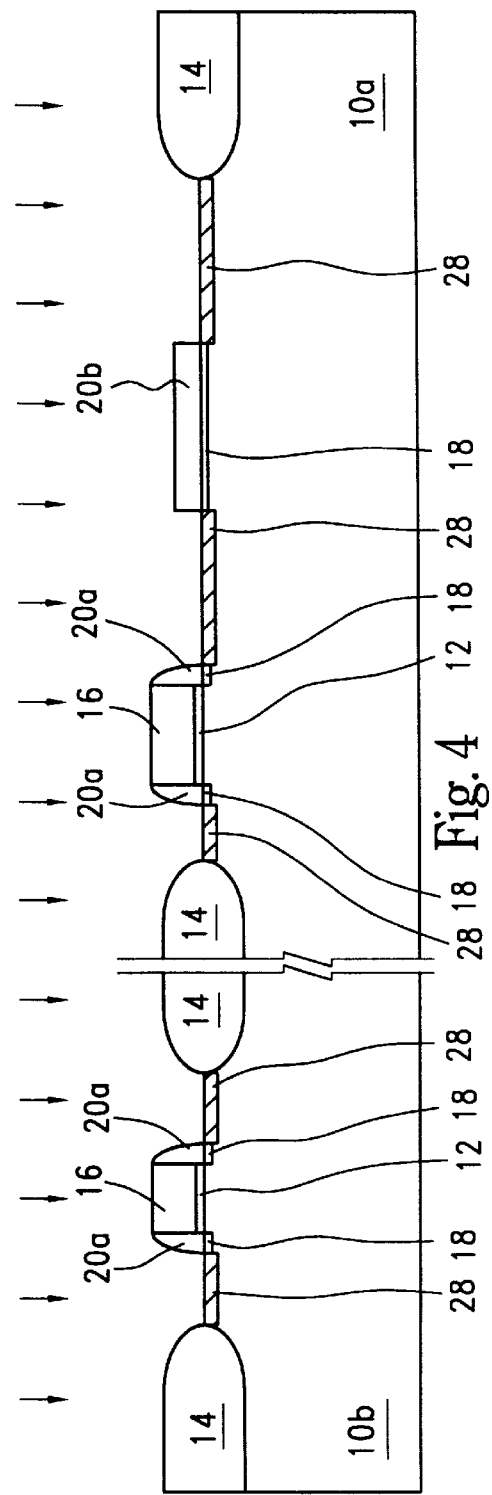

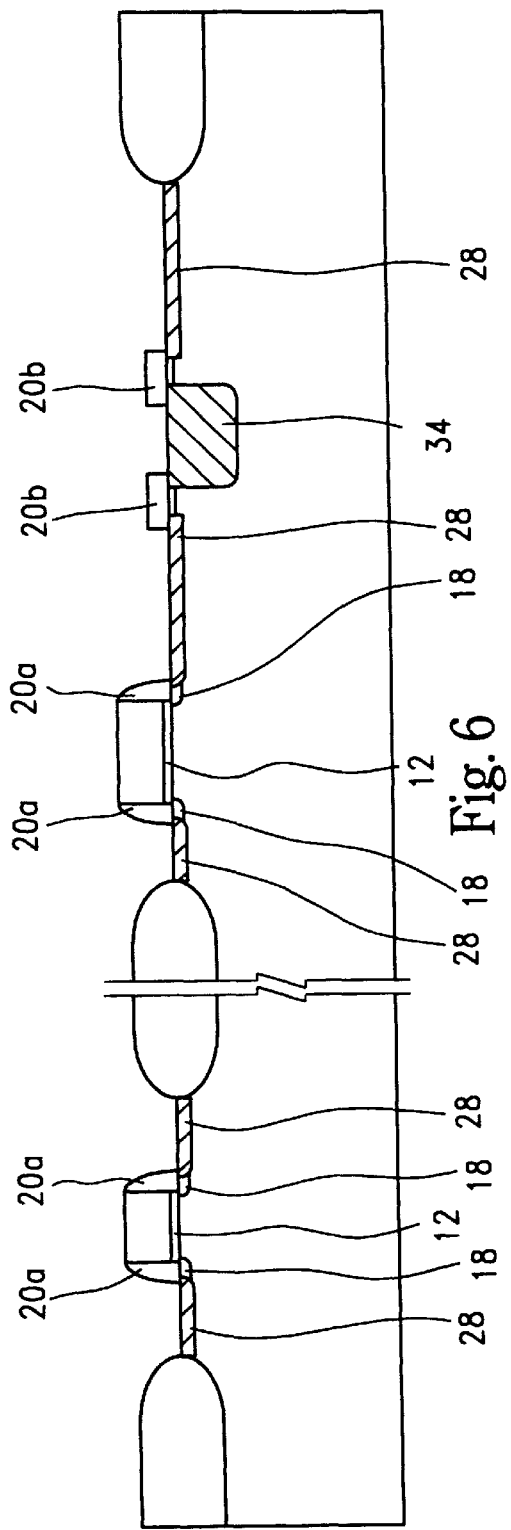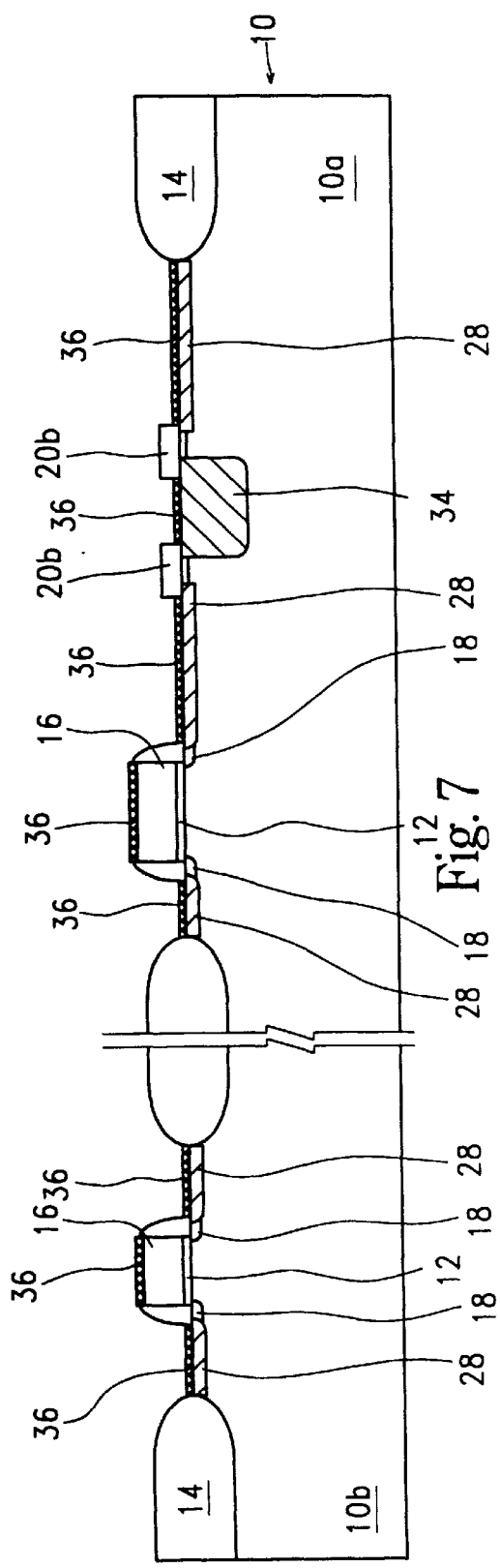

METHOD FOR FORMING SELF-ALIGNED SILICIDED MOS TRANSISTORS WITH ESD PROTECTION IMPROVEMENT

Finally, unreacted portions of the metal layer are removed.

CROSS REFERENCE TO RELATED APPLICATIONS

This invention is a continuation-in-part application of an application filed under the title of "SELF-ALIGNED SILICIDED MOS TRANSISTOR WITH ESD PROTECTION IMPROVEMENT" with the serial number of Ser. No. 08/996,694, filed Dec. 23, 1997 and U.S. Pat. No. 6,022,769, which is assigned to same assignee with the same inventor as the present application.

FIELD OF THE INVENTION

The present invention relates to the transistors in semiconductor manufacturing, and more specifically, to a method of forming self-aligned silicided MOS (metal oxide semiconductor) transistors with ESD protection improvement in the semiconductor manufacturing processes.

BACKGROUND OF THE INVENTION

With the progress in the semiconductor integrated circuits reaching to ULSI (ultra large scale integration) level or even higher levels, the integrity of the integrated circuits has risen at an amazing rate. The capacity of a single semiconductor chip increases from several thousand devices to hundreds of million devices, or even billions of devices. Taking DRAM (dynamic random access memories) for example, the increasing integrity in manufacturing has extended the capacity of a single chip to step from earlier 4 megabit to 16 megabit, and further to 256 megabit or even higher. Integrated circuit devices like transistors, capacitors, and connections must be greatly narrowed accompanying with the advancement. The increasing packing density of integrated circuits generates numerous challenges to the semiconductor manufacturing process. Every element or device needs to be formed within a smaller area without influencing the characteristics and operations of the integrated circuits.

The demands on high packing density, low heat generation, and low power consumption devices with good reliability and long operation life must be maintained without any degradation in the function. These achievements are expected to be reached with the simultaneous developments and advancements in the photography, etching, deposition, ion implantation, and thermal processing technologies, the big five aspects of semiconductor manufacturing. The present technology research focus mainly on the sub-micron and one-tenth micron semiconductor devices to manufacture highly reliable and densely arranged integrated circuits.

Transistors, or more particularly metal oxide semiconductor (MOS) transistors, are the most important and frequently employed devices in integrated circuits. However, with the continuous narrowing of device size, the sub-micron scale MOS transistors have to face many risky challenges. As the MOS transistors become narrower and thinner accompanied by shorter channels, problems like the junction punchthrough, leakage, and contact resistance cause the reduction in the yield and reliability of the semiconductor manufacturing processes. The technologies like the self-aligned silicide (salicide) and the shallow junctions are utilized in combating the undesirable effects to manufacture the densely packing devices with good yield.

The electrostatic discharge (ESD) attacking has became a serious problem as the feature size of the MOS transistors has been scaled down. A semiconductor device having the input/output pad connections with external circuitry and devices is subject to the problem of the ESD. The ESD is easily conducted through the input/output and the power lead connections into the internal devices and causes some problems to semiconductor devices, especially serious ones like gate oxide breakdown and overheating damages.

The high voltage gradient generated between the contacts and the channels from the ESD causes the gate oxide electron injection and the carrier acceleration effect in the channels. The characteristics and operations of the devices are easily influenced by the inducing effects of the ESD. High levels of ESD with several hundred volts to a few thousand volts, which is easily transferred to the pins of an IC package during the handling, can bring permanent destruction to the internal devices. For preventing the devices from ESD damage built-in ESD protection circuits are connected between the input/output pads and the internal circuitry. A high level of abnormal discharge conducted into the pins of an IC package is kept out by the ESD protection circuits from flowing into the devices. The discharges are guided through the ESD protection circuits to the ground and the damage to the semiconductor devices is eliminated.

Several improvements in combating the ESD problem by forming the ESD protection devices have been provided previously. For example, U.S. Pat. No. 5,559,352 to C. C. Hsue and J. Ko disclosed a method of forming an ESD protection device with reduced breakdown voltage. Their invention employed a lightly implanted region of opposite conductivity type with the source/drain regions centered under the heavier implanted source/drain region. As another example, U.S. Pat. No. 5,498,892 to J. D. Walker and S. C. Gioia disclosed a lightly doped drain ballast resistor. In their work, a field effect transistor with an improved electrostatic discharge (ESD) protection using a ballast resistor in the drain region is identified. The ballast resistor laterally distributes current along the width of the drain during an ESD pulse, which reduces local peak current density and reduces damage. But the operation speed problem with small feature size devices is still not solved. In addition, for applying most of the improvements, great efforts are needed with variations required in the semiconductor manufacturing circuits, thus increasing cost.

In manufacturing sub-micron feature size semiconductor devices, the salicide technology is a vital application to improve the operation speed of the ULSI/VLSI MOS devices. Unfortunately, there exists some trade-offs in employing the technologies like self-aligned silicide when facing the ESD problem. The devices with the self-aligned silicided contacts shows a worse ESD performance than the non-salicided devices. In general, thicker salicide has a negative effect on the ESD protection and makes semiconductor devices to be more sensitive to the ESD voltage and to be damaged more easily. The details are explored by the investigation of A. Amerasekera et al. ("Correlating Drain Junction Scaling, Salicide Thickness, and Lateral NPN behavior with the ESDIEOS Performance of a 0.25 $\mu$m CMOS Process.", IEDM Tech. Dig., p. 893, IEEE 1996) Their investigation presents the physical mechanisms involved in the degradation of ESD performance with the shallower junctions, the thicker salicides, and the different epitaxial thicknesses. The ESD challenge of salicide technology with the smaller scale devices can be clearly understood by referencing their work.

SUMMARY OF THE INVENTION

A MOS transistor on a semiconductor substrate with a self-aligned silicide and a junction diode for ESD protection improvement is formed with the method of the present invention. The ESD protection devices in the ESD protective region can be formed simultaneously with the NMOS, the PMOS, or both kinds of transistors in the functional region, with only the addition of one lithography process or the variation of the mask in the already existing processes. The lithography process in defining the junction diode of the MOS transistor for ESD protection is quite cost efficient compared with the upcoming advantages.

Moreover, the ESD protection effect is raised with a low breakdown junction diode. A lightly doped drain (LDD) structure and an ultra-shallow junction are embedded in the devices formed by the method. The short channel effect and its accompanying hot carrier effect is eliminated. ESD damage from external connections to the integrated circuits are kept from the densely packed devices. The self-aligned silicide (salicide) technology employed in the present invention for forming the contacts with both low resistance and capacitance provides high gate switching and operation speed with a low RC delay. Integrated circuits with ESD hardness, high circuit operation speed, and low power consumption of the functional devices are provided by the semiconductor manufacturing process employing the method disclosed.

The method of forming a MOS transistor in a semiconductor substrate with the self-aligned silicide contact for ESD protection includes the following steps. At first, isolation regions are formed in the semiconductor substrate to separate the semiconductor substrate into an ESD protective region for at least one transistor, and a functional region for a plurality of integrated circuit devices. A gate insulator layer is formed on the substrate and a polysilicon layer is formed on the gate insulator layer. The polysilicon layer is then patterned to form gate structures on the ESD protective region and the functional region. The semiconductor substrate is doped for forming a first doped region in the semiconductor substrate under a region uncovered by the isolation regions and the gate structures.

Next, an insulator layer is formed over the semiconductor substrate and the gate structure. A portion of the insulator layer and a portion of the gate insulator layer are removed to form spacer structures surrounding the gate structures, and also to form an insulator block aside from the gate structures of the ESD protective region on a lateral side of the gate structures to expose portions of the semiconductor substrate on both sides of the insulator block. The semiconductor substrate is doped for forming a second doped region in the semiconductor substrate under a region covered by the spacer structures, the gate structures, the isolation regions, and the insulator block. In the preferred embodiments, the second doped region has the same type dopants with the first doped region.

Following the formation of the second doped region, an insulator opening is defined within the insulator block. The semiconductor substrate is then doped for forming a third doped region in the semiconductor substrate under the insulator opening. In the preferred embodiments, the third doped region has opposite type dopants with the second doped region and the first doped region. A first thermal annealing is then performed to the semiconductor substrate to drive-in dopants in the first doped region, the second doped region, and the third doped region. A metal layer is then formed on the semiconductor substrate and a second thermal annealing is performed to the semiconductor substrate to form a metal silicide layer on the gate structures, and on the substrate over the second doped region and the third doped region. Finally, unreacted portions of the metal layer are removed.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 1 illustrates a cross-sectional view of forming isolation regions, forming a gate insulator layer, and forming and patterning a polysilicon layer to form gate structures on the ESD protective region and the functional region in accordance with the present invention.

FIG. 2 illustrates a cross-sectional view of forming an insulator layer over the semiconductor substrate and the gate structure in accordance with the present invention.

FIG. 3 illustrates a cross-sectional view of removing a portion of the insulator layer and of the gate insulator layer to form spacer structures and an insulator block in accordance with the present invention.

FIG. 4 illustrates a cross-sectional view of doping the semiconductor substrate for forming a second doped region in the semiconductor substrate in accordance with the present invention.

FIG. 6 illustrates a cross-sectional view of performing a first thermal annealing to the semiconductor substrate to drive-in dopants in the first doped region, the second doped region, and the third doped region in accordance with the present invention.

FIG. 7 illustrates a cross-sectional view of forming a metal silicide layer on the gate structures, on the substrate over the second doped region and the third doped region in accordance with the present invention.

DETAILED DESCRIPTION OF THE PREFERRED EMBODIMENT

Figure 5:
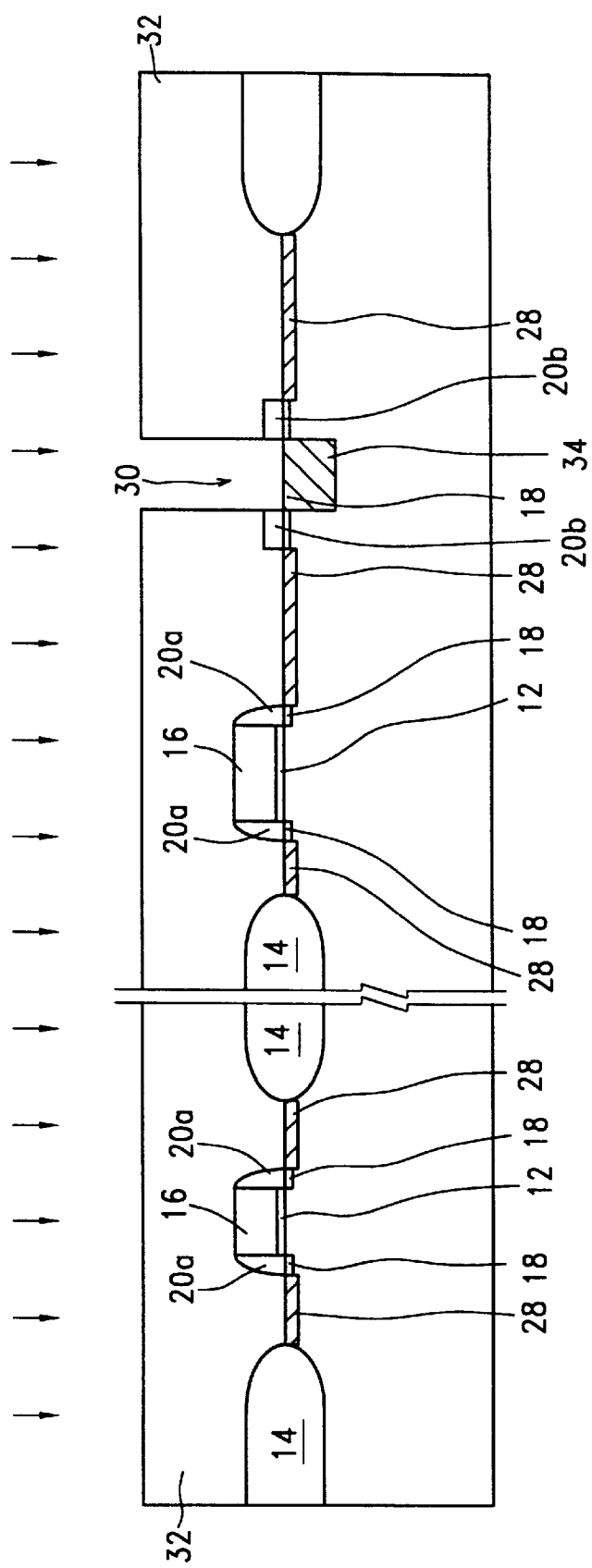
FIG. 5 illustrates a cross-sectional view of defining an insulator opening within the insulator block and doping the semiconductor substrate for forming a third doped region in accordance with the present invention.

A method of forming a self-aligned silicided MOS transistor with an ESD protection improvement in the semiconductor manufacturing processes is provided in the present invention. Via an ESD protection structure and the circuits connecting with the input/output terminals, any undesirable high voltage discharge can be conducted to the ground through the substrate and the internal devices are prevented from the damaging. The method can be incorporated into conventional semiconductor manufacturing processes for manufacturing the NMOS, the PMOS, or both kind of transistors in a functional region.

One, or generally more, ESD protection MOS transistors are formed in ESD protective simultaneously with only slight and cost efficient adjustments of the processes. The transistors in both the ESD protective region and the functional region with a lightly doped drain (LDD) structure and an ultra-shallow junction can be manufactured. The hot carrier effect accompanying with the short channel problems can be eliminated. The self-aligned silicide (salicide) technology employed in the present invention for forming low resistance contacts provides a high operation speed with a low heat generation and a low power consumption. The method for forming the small feature size devices like sub-micron scale devices overcoming present ESD and operation speed challenges is described as following.

The method and the steps in the present invention applied on a semiconductor wafer can create the NMOS transistors and the MOS transistors with ESD protection improvement at the same time. The PMOS transistors can also be built at the same time. Since the variations in the processes for incorporating the formation of the PMOS transistors are well known in the art, the details are not described. Referring to FIG. 1, a semiconductor substrate 10 with a preferable single crystalline silicon in a <100>direction is provided. Isolation regions, like field oxide (FOX) regions 14, are formed on the semiconductor substrate 10.

In general, a thin silicon oxide layer 12 is thermally grown on the semiconductor substrate 10 with the thickness in the range of about 20 angstroms to 300 angstroms. A silicon nitride layer, which is not shown in the figure, is then deposited thereon. The silicon nitride layer is utilized as a layer for inhibiting the FOX growth on an active region of the semiconductor substrate. The silicon nitride layer is then patterned to etch off the region for forming the FOX. The semiconductor substrate 10 is subjected to a thermal process, for example, the thermal process performed in a steam and oxygen containing ambient. Portions of the silicon oxide layer 12 uncovered by the silicon nitride layer is grown to be the FOX regions 14 to serve as isolation regions. The FOX regions 14 separate the semiconductor substrate into an ESD protective region 10a for one or more transistors, and a functional region 10b for a plurality of integrated circuit devices. The silicon nitride layer is than removed using etchants like hot phosphoric acid solution. The isolation regions can be created through other isolation technologies which are known in the art, like trench isolations and so on, with the same purpose in defining respective active regions.

A polysilicon layer is then deposited with the thickness ranging from about 1,000 angstroms to 4,000 angstroms onto the semiconductor substrate 10. As an example, the process like a low pressure chemical deposition (LPCVD) process can be used in forming the polysilicon layer. Then a patterning process is performed to define polysilicon structures 16 on both the ESD protective region 10a and the functional region 10b, as shown in FIG. 1. The patterning of the polysilicon layer can be done by the method like an anisotropic etching using an etchant within the great variety of choices like $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

A doping process to the semiconductor substrate 10 is performed to form a first doped region 18 in the semiconductor substrate 10 under a region uncovered by the isolation regions 14 and the gate structures 16. The first doped region 18 preferably serves as lightly doped junctions in the ESD protective region 10a and the functional region 10b. In such case, an ion implantation of phosphorous- or arsenic containing ions is performed at an energy between about 10 KeV to 100 KeV, to have a dose between about 1E12 to 1E14 atoms/cm$^2$.

Referring to FIG. 2, an insulator layer 20 is formed over the semiconductor substrate 10 conformably covering the gate structures 16. In such case, a silicon oxide layer is deposited by chemical vapor deposition (CVD) with a thickness of about 1,000 angstroms to 4,000 angstroms. Referring to FIG. 3, a portion of the insulator layer 20 and a portion of the gate insulator layer 12 are then removed to form spacer structures 20a surrounding the gate structures 16, and an insulator block 20b which is located aside from the gate structure 16 of the ESD protective region 10b on a lateral side of the gate structure 16 to expose portions of the semiconductor substrate 10 on both sides of the insulator block 20b, as illustrated in FIG. 3. Turning back to FIG. 2, the region for leaving the insulator block 20b can be defined with a photoresist layer 22 with a lithography process. The removal of a portion of the insulator layer 20 and of the gate insulator layer 12 are preferably performed via an etchant taken from $CF_4$, $CCl_2F_2$, $CHF_3/CF_4$, $CHF_3/O_2$, $CH_3CHF_2$ in an anisotropic etching process.

Referring to FIG. 4, following with the formation of the spacer structures 20a and the insulator block 20b, another doping process is performed to the semiconductor substrate 10 for forming a second doped region 28 in the semiconductor substrate 10 under a region uncovered by the spacer structures 20a, the gate structures 16, the isolation regions 14, and the insulator block 20b. In the preferred embodiments, the second doped region 28 has the same type dopants, namely n-type dopants, with the first doped region 18. In such case, an ion implantation of phosphorous or arsenic at an energy between about 5 KeV to 80 KeV having a dose of between about 5E14 to 2E16 atoms/cm$^2$ is employed. The second doped region 28 mainly serves as source/drain regions for transistors on the semiconductor substrate 10.

Referring to FIG. 5, an insulator opening 30 is defined within the insulator block 20b by removing a portion of the insulator block 20b, or preferably the center part of the insulator block 20b as illustrated in the figure. The removal of a portion of the insulator block 20b is preferably performed via an etchant taken from $CF_4$, $CCl_2F_2$, $CHF_3/CF_4$, $CHF_3/O_2$, $CH_3CHF_2$ in an anisotropic etching process. The pattern of the insulator opening 30 within the insulator block 20b can be defined with a photoresist layer 32 on the semiconductor substrate 10 with an accompanying lithography process.

The semiconductor substrate 10 is then doped for forming a third doped region 34 in the semiconductor substrate under 10 the insulator opening 30. In the preferred embodiments, the third doped region 34 is doped to have opposite type dopants, with the second doped region 28 and the first doped region 18, or namely p-type dopants in such case. Using the photoresist layer 32 as a doping mask, a process like an ion implantation of boron containing dopants like $BF_2$ or boron ions is preferably performed at an energy ranging from about 10 KeV to 150 KeV having a dose between about 5E12 to 5E15 atoms/cm$^2$. Under the insulator opening 30, the implanted ions compensate for the original concentration in the first doped region 18 with the larger dose and increase the current resistance with the formation of the third doped region 34. Thus a junction diode with a low breakdown voltage is formed by the combination the second doped region 28 and the third doped region 34.

Following with the formation of the junction diode, the photoresist layer 32 is removed. Referring to FIG. 6, a thermal annealing process is performed to the semiconductor substrate 10 to drive in and activate the dopants in the first doped region 18, the second doped region 28, and the third doped region 34. An ultra-shallow junction of the second doped region 28 is formed in the active regions like a source region and a drain region in both the ESD protective region 10a and the functional region 10b. The dopants in the third doped region 34 are also driven in and activated for combining with the aforementioned ultra-shallow junction to act as the aforementioned junction diode. Lightly doped junctions are formed by the diffusion of the dopants in the first doped region 18 under the spacer structures 20a.

Finally, a self-aligned silicide (salicide) technology is utilized to complete the method of the present invention. A metal layer is formed on the semiconductor substrate using the method like a chemical vapor deposition or a sputtering process generally with a thickness of about 100 angstroms to 1,000 angstroms. A metal material like Ti, Co, W, Ni, Pt, etc., can be used. A thermal annealing process, preferably a rapid thermal process in a nitrogen ambient with a temperature of about 600° C. to 1000° C., is performed to the semiconductor substrate 10. A metal silicide layer 36 is formed on the regions having exposed silicon surface, namely on the gate structures 16 and on the substrate 10 over the second doped region 28 and the third doped region 34.

Next, unreacted portions of the metal layer are then removed to finish the salicidation process. The removal of the unreacted portions of the metal layer can be achieved by a wet etching using a solution containing $NH_4OH$, $H_2O$, and $H_2O_2$ as an example. With the covering insulator block 20a on the ESD protective region 10a, the metal silicide layer 36 can be formed without degrading the ESD protection effect of the circuits. The resistance and capacitance of the contacts or the interconnection paths of the integrated circuits is greatly reduced in both the ESD protective region 10a and the functional region 10b. The following processes after the formation of the salicide, like making the interconnections, the insulation layers and the passivation layers, are dependent upon the various specification of the integrated circuits. The processes are well-known in the art and are not described here.

For a detailed understanding of the self-aligned silicide technology, the modeling made by P. Fomara and A. Poncet ("Modeling of Local Reduction in $TiSi_2$ and $CoSi_2$ Growth Near Spacers in MOS Technologies: Influence of Mechanical Stress and Main Diffusing Species", IEDM Tech. Dig., P. 73, 1996) can be referenced. A comprehensive silicide growth model is developed in identifying the influence of the main diffusing species and mechanical stresses.

An MOS transistor on a semiconductor substrate with a self-aligned silicide and a junction diode for ESD protection improvement is formed with the method of the present invention. The ESD protection devices in the ESD protective region can be formed simultaneously with the NMOS, the PMOS, or both kinds of devices in the functional region, with only the addition of one lithography process, or only the variation in the mask of the already existed processes.

The lithography process in defining the junction diode of the MOS transistor for ESD protection is quite cost efficient compared to the advantages addressed. With the formation of a low breakdown junction diode with in the ESD protective region, the undesirable high voltage discharges as high as several thousand volts can be conducted to the ground. The transistors in both the ESD protective region and the functional region with a lightly doped drain (LDD) structure and an ultra-shallow junction can be manufactured. The hot carrier effect accompanied by the short channels can be eliminated. The contacts with low resistance and capacitance forming from a self-aligned silicide (salicide) technology bring minimum RC delay due to the interconnect paths. A high operation or gate switching speed can be achieved with low heat generation and power consumption.

As is understood by a person skilled in the art, the foregoing descriptions of the preferred embodiment of the present invention are illustrative of the present invention rather than presenting limitations thereon. It is intended to cover various modifications and similar arrangements included within the spirit and scope of the appended claims. The scope of the claims should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming MOS transistors on a semiconductor substrate, said method comprising the steps of:

forming isolation regions in said semiconductor substrate, said isolation regions separating said semiconductor substrate into an ESD protective region for at least one transistor and a functional region for a plurality of integrated circuit devices;

forming a gate insulator layer on said substrate;

forming a polysilicon layer on said gate insulator layer;

patterning said polysilicon layer to form gate structures on said ESD protective region and said functional region;

doping said semiconductor substrate for forming a first doped region in said semiconductor substrate under a region uncovered by said isolation regions and said gate structures;

forming an insulator layer over said semiconductor substrate and said gate structure;

removing a portion of said insulator layer and of said gate insulator layer to form spacer structures surrounding said gate structures, and an insulator block aside from said gate structures of said ESD protective region on a lateral side of said gate structures to expose portions of said semiconductor substrate on both sides of said insulator block;

doping said semiconductor substrate for forming a second doped region in said semiconductor substrate under a region uncovered by said spacer structures, said gate structures, said isolation regions, and said insulator block, said second doped region having same type dopants with said first doped region;

defining an insulator opening within said insulator block;

doping said semiconductor substrate for forming a third doped region in said semiconductor substrate under said insulator opening, said third doped region having opposite type dopants with said second doped region and said first doped region;

performing a first thermal annealing to said semiconductor substrate to drive-in dopants in said first doped region, said second doped region, and said third doped region;

forming a metal layer on said semiconductor substrate;

performing a second thermal annealing to said semiconductor substrate to form a metal silicide layer on said gate structures, and on said substrate over said second doped region and said third doped region; and removing unreacted portions of said metal layer.

2. The method of claim 1, wherein said isolation regions comprise field oxide isolations, said field oxide isolations being formed by growing a portion of said semiconductor substrate, in order to separate said semiconductor substrate into said ESD protective region and said functional region.

3. The method of claim 1, wherein said step of doping to form said first doped region is performed by an ion implanting process with dopants selecting from the group consisting of arsenic containing dopants and phosphorous containing dopants, at an energy between about 10 KeV to 100 KeV with a dose between about 1E12 to 1E14 atoms/$cm^2$.

4. The method of claim 1, wherein said step of doping to form said second doped region is performed by an ion implanting process with dopants selecting from the group consisting of arsenic containing dopants and phosphorous containing dopants, at an energy between about 5 KeV to 80 KeV with a dose between about 5E14 to 2E16 atoms/$cm^2$.

5. The method of claim 1, wherein said step of doping to form said third doped region is performed by an ion implanting process with boron containing dopants, at an energy between about 10 KeV to 150 KeV with a dose between about 5E12 to 5E15 atoms/cm$^2$.

6. The method of claim 1, wherein said gate insulator layer comprises silicon oxide being grown thermally in an oxygen ambient from said semiconductor substrate to a thickness between about 20 to 300 angstroms.

7. The method of claim 1, wherein said polysilicon layer is deposited with a chemical vapor deposition process to a thickness between about 1,000 to 4,000 angstroms.

8. The method of claim 1, wherein said step of patterning said polysilicon layer is achieved with an anisotropic etching using an etchant which is selected from the group consisting of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

9. The method of claim 1, wherein said step of removing a portion of said insulator layer and said gate insulator layer is performed with an etchant which is selected from the group consisting of $CF_4$, $CCl_2F_2$, $CHF_3/CF_4$, $CHF_3/O_2$, $CH_3CHF_2$ in an anisotropic etching.

10. The method of claim 1, wherein said insulator layer comprises a silicon oxide layer which is deposited with a thickness of about 1,000 angstroms to 4,000 angstroms.

11. The method of claim 1, wherein said metal layer comprises a metal selected from the group consisting of Ti, Co, W, Ni and Pt.

12. The method of claim 1, wherein said second thermal annealing for forming a metal silicide layer is performed with a rapid thermal process in a nitrogen ambient with a temperature of about 600° C. to 1,000° C.

13. The method of claim 1, wherein said step of removing said unreacted portions of said metal layer is carried out by a wet etch of a solution containing $NH_4OH$, $H_2O$, and $H_2O_2$.

14. A method of forming MOS transistors on a semiconductor substrate, said method comprising the steps of:

forming isolation regions in said semiconductor substrate, said isolation regions separating said semiconductor substrate into an ESD protective region for at least one transistor and a functional region for a plurality of integrated circuit devices;

forming a gate insulator layer on said substrate;

forming a polysilicon layer on said gate insulator layer;

patterning said polysilicon layer to form gate structures on said ESD protective region and said functional region;

doping said semiconductor substrate for forming a first doped region in said semiconductor substrate under a region uncovered by said isolation regions and said gate structures;

forming an insulator layer over said semiconductor substrate and said gate structure;

removing a portion of said insulator layer and of said gate insulator layer to form spacer structures surrounding said gate structures, and an insulator block aside from said gate structures of said ESD protective region on a lateral side of said gate structures to expose portions of said semiconductor substrate on both sides of said insulator block;

doping said semiconductor substrate for forming a second doped region in said semiconductor substrate under a region uncovered by said spacer structures, said gate structures, said isolation regions, and said insulator block;

defining an insulator opening within said insulator block;

doping said semiconductor substrate for forming a third doped region in said semiconductor substrate under said insulator opening;

performing a first thermal annealing to said semiconductor substrate to drive-in dopants in said first doped region, said second doped region, and said third doped region;

forming a metal layer on said semiconductor substrate;

performing a second thermal annealing to said semiconductor substrate to form a metal silicide layer on said gate structures, and on said substrate over said second doped region and said third doped region; and removing unreacted portions of said metal layer.

15. The method of claim 14, wherein said step of doping to form said first doped region is performed by an ion implanting process with dopants selecting from the group consisting of arsenic containing dopants and phosphorous containing dopants, at an energy between about 10 KeV to 100 KeV with a dose between about 1E12 to 1E14 atoms/cm$^2$.

16. The method of claim 15, wherein said step of doping to form said second doped region is performed by an ion implanting process with dopants selecting from the group consisting of arsenic containing dopants and phosphorous containing dopants, at an energy between about 5 KeV to 80 KeV with a dose between about 5E14 to 2E16 atoms/cm$^2$.

17. The method of claim 16, wherein said step of doping to form said third doped region is performed by an ion implanting process with boron containing dopants, at an energy between about 10 KeV to 150 KeV with a dose between about 5E12 to 5E15 atoms/cm$^2$.

18. The method of claim 14, wherein said step of patterning said polysilicon layer is achieved with an anisotropic etching using an etchant which is selected from the group consisting of $Cl_2$, $BCl_3/CF_4$, $SiCl_4/Cl_2$, $BCl_3/Cl_2$, $HBr/Cl_2/O_2$, $HBr/O_2$, $Br_2/SF_6$, $SF_6$, and $CF_4$.

19. The method of claim 14, wherein said step of removing a portion of said insulator layer and said gate insulator layer is performed with an etchant which is selected from the group consisting of $CF_4$, $CCl_2F_2$, $CHF_3/CF_4$, $CHF_3/O_2$, $CH_3CHF_2$ in an anisotropic etching.

20. The method of claim 14, wherein said insulator layer comprises a silicon oxide layer which is deposited with a thickness of about 1,000 angstroms to 4,000 angstroms.

* * * * *